(12) United States Patent
Lee et al.

(10) Patent No.: US 11,990,924 B2
(45) Date of Patent: May 21, 2024

(54) TRANSFORMER-BASED AMPLIFIER, OPERATING METHOD THEREOF, AND DEVICES INCLUDING THE SAME

(71) Applicant: ELECTRONICS AND TELECOMMUNICATIONS RESEARCH INSTITUTE, Daejeon (KR)

(72) Inventors: Hui Dong Lee, Daejeon (KR); Sunwoo Kong, Daejeon (KR); Bong Hyuk Park, Daejeon (KR); Seunghyun Jang, Daejeon (KR); Seok Bong Hyun, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 152 days.

(21) Appl. No.: 17/577,272

(22) Filed: Jan. 17, 2022

(65) Prior Publication Data
US 2022/0321153 A1    Oct. 6, 2022

(30) Foreign Application Priority Data
Apr. 2, 2021    (KR) .................. 10-2021-0043186

(51) Int. Cl.
*H04B 1/04*   (2006.01)
*H03F 3/19*   (2006.01)

(52) U.S. Cl.
CPC ............. *H04B 1/04* (2013.01); *H03F 3/19* (2013.01); *H03F 2200/216* (2013.01); *H03F 2200/301* (2013.01)

(58) Field of Classification Search
None
See application file for complete search history.

(56) References Cited

U.S. PATENT DOCUMENTS

| | | | |
|---|---|---|---|
| 9,584,076 B2 * | 2/2017 | Ortiz | ............ H03F 1/0205 |
| 10,770,770 B2 * | 9/2020 | Sharma | ............ H03H 7/185 |
| 11,271,597 B1 * | 3/2022 | Huang | ............ H04B 1/04 |
| 2011/0199141 A1 | 8/2011 | Shin et al. | |

(Continued)

FOREIGN PATENT DOCUMENTS

| | | |
|---|---|---|
| KR | 10-1259605 B1 | 4/2013 |
| KR | 10-1768361 B1 | 8/2017 |

(Continued)

OTHER PUBLICATIONS

Hyo-Sung Lee et al., "W-Band CMOS 4-Bit Phase Shifter for High Power and Phase Compression Points", Published in IEEE Transactions on Circuits and Systems II: Express Briefs, Jan. 2015, pp. 1-5, vol. 62, Issue 1.

(Continued)

*Primary Examiner* — Pablo N Tran

(57) ABSTRACT

A transformer-based amplifier, an operating method thereof, and devices including the same are disclosed. A millimeter wave amplifier includes a first transformer positioned on an input side of the millimeter wave amplifier, a second transformer positioned on an output side of the millimeter wave amplifier, and one or more of amplification stages positioned between the first transformer and the second transformer.

17 Claims, 13 Drawing Sheets

(56) References Cited

U.S. PATENT DOCUMENTS

| | | | |
|---|---|---|---|
| 2015/0035619 A1 | 2/2015 | Moon et al. | |
| 2015/0249437 A1* | 9/2015 | Morishita | H03G 3/3036 330/285 |
| 2015/0349726 A1* | 12/2015 | Han | H03F 3/19 330/250 |
| 2017/0149394 A1 | 5/2017 | Kao et al. | |
| 2019/0199298 A1* | 6/2019 | Takenaka | H03F 1/565 |
| 2022/0021352 A1* | 1/2022 | Honda | H03F 3/45475 |
| 2023/0020495 A1* | 1/2023 | Lehtola | H03F 3/245 |

FOREIGN PATENT DOCUMENTS

| | | |
|---|---|---|
| KR | 10-2042120 B1 | 11/2019 |
| KR | 10-2045498 B1 | 11/2019 |

OTHER PUBLICATIONS

Yu-Hsuan Lin et al., "A low phase and gain error passive phase shifter in 90 nm CMOS for 60 GHz phase array system application", Published in: 2016 IEEE MTT-S International Microwave Symposium (IMS), May 22-27, 2016, pp. 1-4.

\* cited by examiner

TRANSFORMER-BASED AMPLIFIER, OPERATING METHOD THEREOF, AND DEVICES INCLUDING THE SAME

CROSS-REFERENCE TO RELATED APPLICATION

This application claims the benefit of Korean Patent Application No. 10-2021-0043186 filed on Apr. 2, 2021, in the Korean Intellectual Property Office, the entire disclosure of which is incorporated herein by reference for all purposes.

BACKGROUND

1. Field of the Invention

One or more example embodiments relate to a transformer-based amplifier, an operating method thereof, and devices including the same.

2. Description of the Related Art

Recently, the need to change a phase and an amplification of a signal is increasing, in response to the use of phase array antennas increasing.

In a typical three stage millimeter wave amplifier, an input signal may be applied to a first amplification stage through an input matching circuit and be applied to a second amplification stage after passing through an interstage matching circuit between the first amplification stage and the second amplification stage. Similarly, the input signal may be applied to a final amplification stage after passing through a different interstage matching circuit and a signal amplified by the final amplification stage may be finally output after passing through an output matching circuit. The degrees of amplification stages may vary based on a desired gain value in a system.

A typical millimeter wave amplifier may only perform an amplification function of a received signal and may not perform a phase shift function. For the amplification and the phase shift function to be performed simultaneously, a phase shifter may need to be disposed inside or outside of a radio frequency (RF) or a millimeter chip.

The phase shifter may have phase shift characteristics of 0 degrees (°)/180°, 0°/22.5°, 0°/45°, 0°/5.625°, 0°/11.25°, and 0°/90° based on a switch. When a plurality of phase shifters is used, a phase may be shifted from 0° to 354.375° in units of 5.625°. A phase shift may be a difference in a phase of an output signal and a phase of an input signal of the phase shifter.

The above description is information the inventor(s) acquired during the course of conceiving the present disclosure, or already possessed at the time, and is not necessarily art publicly known before the present application was filed.

SUMMARY

Example embodiments provide a millimeter wave amplifier that enables a signal phase shift using a transformer.

However, technical tasks to be achieved by the present disclosure are not limited to the above-described technical tasks, and other technical tasks may exist.

According to an aspect, there is provided a millimeter wave amplifier including a first transformer positioned on an input side of the millimeter wave amplifier, a second transformer positioned on an output side of the millimeter wave amplifier, and one or more of amplification stages positioned between the first transformer and the second transformer.

One input terminal among input terminals of the first transformer may be connected to a ground, and one output terminal among output terminals of the second transformer may be connected to a ground.

The millimeter wave amplifier may further include one or more of third transformers positioned on the one or more of amplification stages.

The millimeter wave amplifier may further include a first phase shifter positioned on at least one of the input side and the output side of the first transformer and the input side and the output side of the second transformer.

The millimeter wave amplifier may further include a second phase shifter positioned on at least one of an input side and an output side of the third transformer.

The first phase shifter may be a single-phase shifter or a differential phase shifter.

The second phase shifter may be a single-phase shifter or a differential phase shifter.

Of the first transformer and the second transformer being connected to a single-phase shifter, one terminal among connected terminals may be connected to a ground.

Of the third transformer being connected to a single-phase shifter, one terminal among connected terminals may be connected to a ground.

According to another aspect, there is provided a transmitter including a millimeter wave amplifier. The millimeter wave amplifier may include a first transformer positioned on an input side of the millimeter wave amplifier, a second transformer positioned on an output side of the millimeter wave amplifier, and one or more of amplification stages positioned between the first transformer and the second transformer.

One input terminal among input terminals of the first transformer may be connected to a ground, and one output terminal among output terminals of the second transformer may be connected to a ground.

The transmitter may further include one or more of third transformers positioned on the one or more of amplification stages.

The transmitter may further include a first phase shifter positioned on at least one of the input side and the output side of the first transformer and the input side and the output side of the second transformer.

The transmitter may further include a second phase shifter positioned on at least one of an input side and an output side of the third transformer.

The first phase shifter may be a single-phase shifter or a differential phase shifter.

The second phase shifter may be a single-phase shifter or a differential phase shifter.

Of the first transformer and the second transformer being connected to a single-phase shifter, one terminal among connected terminals may be connected to a ground.

Of the third transformer being connected to a single-phase shifter, one terminal among connected terminals may be connected to a ground.

According to another aspect, there is provided a millimeter wave amplifier including one or more of amplification stages, a first transformer configured to convert a single signal into differential signals and transmit the converted signal to an amplification stage, and a second transformer configured to output differential signals output from an amplification stage as a single signal.

According to another aspect, there is provided a transmitter including a millimeter wave amplifier. The millimeter wave amplifier may include one or more of amplification stages, a first transformer configured to convert a single signal into differential signals and transmit the converted signal to an amplification stage, and a second transformer configured to output differential signals output from an amplification stage as a single signal.

Additional aspects of example embodiments will be set forth in part in the description which follows and, in part, will be apparent from the description, or may be learned by practice of the disclosure.

BRIEF DESCRIPTION OF THE DRAWINGS

These and/or other aspects, features, and advantages of the invention will become apparent and more readily appreciated from the following description of example embodiments, taken in conjunction with the accompanying drawings of which.

DETAILED DESCRIPTION

Figure 1:
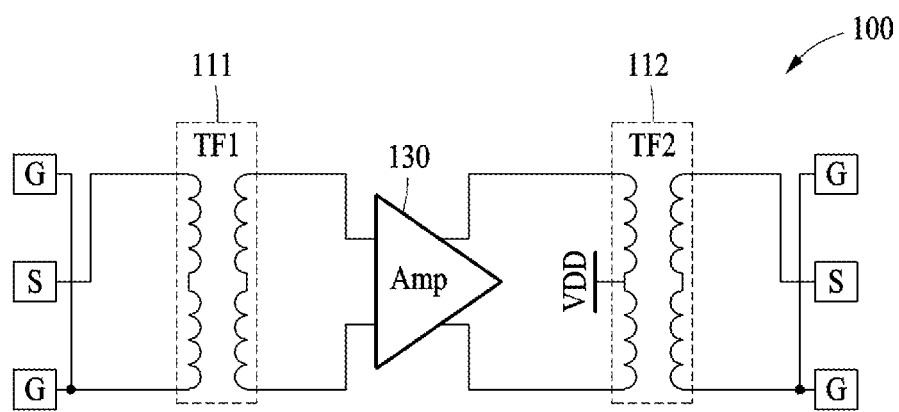
FIG. 1 is a diagram illustrating an example of a structure of a millimeter wave amplifier according to an example embodiment.

The following structural or functional descriptions of example embodiments described herein are merely intended for the purpose of describing the example embodiments described herein and may be implemented in various forms. However, it should be understood that these example embodiments are not construed as limited to the illustrated forms.

Although terms of "first," "second," and the like are used to explain various components, the components are not limited to such terms. These terms are used only to distinguish one component from another component. For example, a first component may be referred to as a second component, or similarly, the second component may be referred to as the first component within the scope of the present disclosure.

When it is mentioned that one component is "connected" or "accessed" to another component, it may be understood that the one component is directly connected or accessed to another component or that still other component is interposed between the two components.

The terminology used herein is for the purpose of describing particular example embodiments only and is not to be limiting of the example embodiments. As used herein, the singular forms "a," "an," and "the" are intended to include the plural forms as well, unless the context clearly indicates otherwise. As used herein, the term "and/or" includes any one and any combination of any two or more of the associated listed items. It will be further understood that the terms "comprises" and/or "comprising," when used in this specification, specify the presence of stated features, integers, steps, operations, elements, components or a combination thereof, but do not preclude the presence or addition of one or more other features, integers, steps, operations, elements, components, and/or groups thereof.

Unless otherwise defined herein, all terms used herein including technical or scientific terms have the same meanings as those generally understood by one of ordinary skill in the art. Terms defined in dictionaries generally used should be construed to have meanings matching contextual meanings in the related art and are not to be construed as an ideal or excessively formal meaning unless otherwise defined herein.

Hereinafter, example embodiments will be described in detail with reference to the accompanying drawings. When describing the example embodiments with reference to the accompanying drawings, like reference numerals refer to like components and a repeated description related thereto will be omitted.

FIG. 1 is a diagram illustrating an example of a structure of a millimeter wave amplifier according to an example embodiment.

Referring to FIG. 1, a millimeter wave amplifier 100 (e.g., a radio frequency (RF) amplifier) may include a first transformer 111, an amplification stage 130, and a second transformer 112. The first transformer 111 may be positioned on an input side of the millimeter wave amplifier 100 (e.g., an input side of the amplification stage 130), and the second transformer 112 may be positioned on an output side of the millimeter wave amplifier 100 (e.g., an output side of the amplification stage 130).

The first transformer 111 may include input terminals and output terminals. One input terminal among the input terminals may be connected to a ground G. The first transformer 111 may receive a single signal through another input terminal that is not connected to the ground G and convert the single signal into differential signals. The first transformer 111 may output the differential signals to the amplification stage 130 through an output terminal.

The amplification stage 130 may amplify the differential signals and output the amplified signal to the second transformer 112. The amplification stage 130 may include an amplifier (e.g., RF amplifier).

The second transformer 112 may include input terminals and output terminals. The second transformer 112 may receive an output (e.g., amplified differential signals) of the amplification stage 130 through the input terminals and output the output as a single signal. One output terminal among the output terminals may be connected to the ground G such that the second transformer 112 may output the single signal through another output terminal that is not connected to the ground G.

The first transformer 111 and the second transformer 112 may perform impedance matching. The first transformer 111 and the second transformer 112 may also serve as a direct current (DC) block. The millimeter wave amplifier 100 may be reduced in size by adding the first transformer 111 and the second transformer 112 to the input side and the output side of the millimeter wave amplifier 100. The millimeter wave amplifier 100 may perform impedance matching and serve as the DC block.

Figure 2:
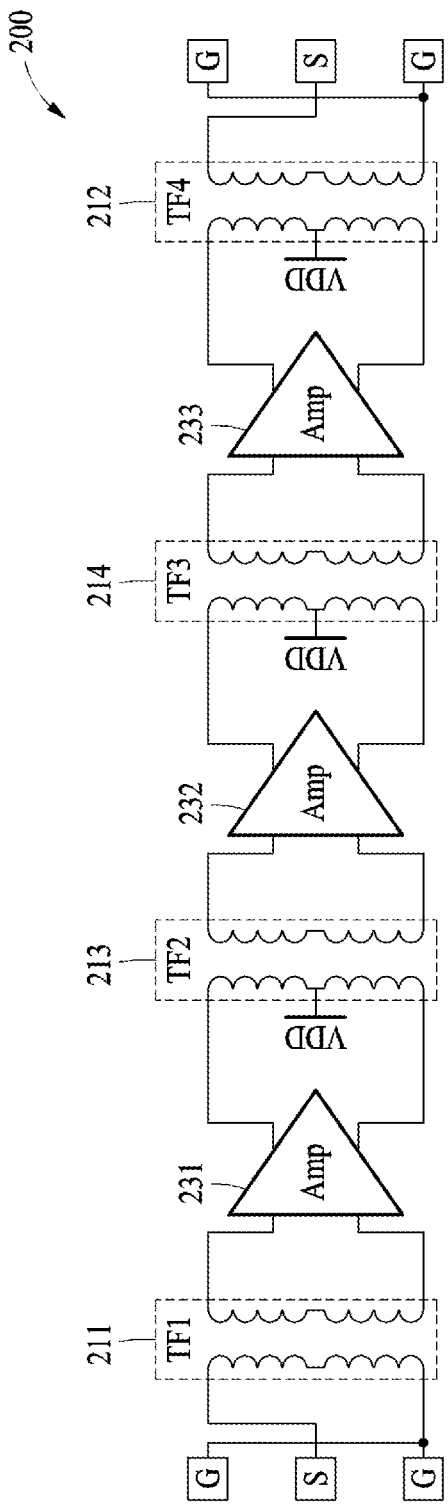
FIG. 2 is a diagram illustrating an example of a structure of a millimeter wave amplifier according to an example embodiment.

FIG. 2 is a diagram illustrating an example of a structure of a millimeter wave amplifier according to an example embodiment.

Referring to FIG. 2, a millimeter wave amplifier 200 (e.g., RF amplifier) may include a first transformer 211, a plurality of amplification stages 231 to 233, and a second transformer 212. The first transformer 211 may be positioned on an input side of the millimeter wave amplifier 200 (e.g., an input side of a first amplification stage 231), and the second transformer 212 may be positioned on an output side of the millimeter wave amplifier 200 (e.g., an output side of a third amplification stage 233). For the convenience of description, a three-stage millimeter wave amplifier 200 including three amplification stages is illustrated in FIG. 2, but the number of amplification stages are not limited thereto, and may include N stages (e.g., N may be a natural number greater than two).

The millimeter wave amplifier 200 may further include one or more of third transformers 213 and 214 positioned between the amplification stages 231 to 233. For example, a third transformer 213 may be positioned between a first amplification stage 231 and a second amplification stage 232, and a third transformer 214 may be positioned between the second amplification stage 232 and a third amplification stage 233.

A structure and operations of the transformers 211 to 214 and the amplification stages 231 to 233 illustrated in FIG. 2 may be substantially the same as the structure and the operations of the transformers 111 and 112 and the amplification stage 130 illustrated in FIG. 1. As described with reference to FIG. 1, the first transformer 211 may receive a single signal through another input terminal that is not connected to the ground G, convert the single signal into differential signals through an output terminal, and output the converted signal to the first amplification stage 231. The second transformer 212 may receive an output (e.g., amplified differential signals) of the third amplification stage 233 through the input terminal and connect the output terminal that is not connected to the ground G among the output terminals as the single signal.

The third transformers 213 and 214 positioned between the amplification stages 231 to 233 may receive an output of a previous amplification stage (e.g., amplified differential signals) and output the received signal to a subsequent amplification stage.

Since output and input bias values do not necessarily have to be the same in the amplification stages 231 to 233, the millimeter wave amplifier 200 may have a flexible design.

Figure 3:
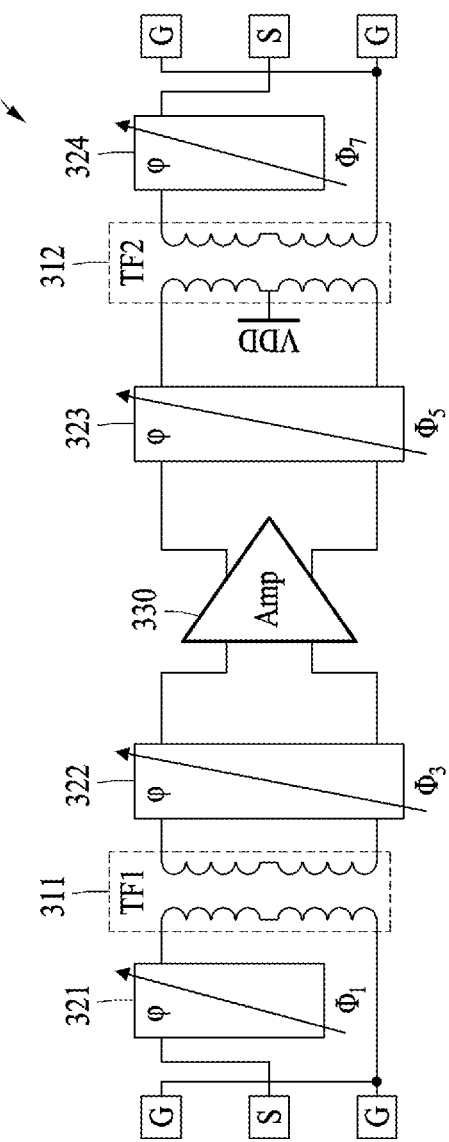
FIG. 3 is a diagram illustrating an example of a structure of a millimeter wave amplifier according to an example embodiment.

FIG. 3 is a diagram illustrating an example of a structure of a millimeter wave amplifier according to an example embodiment.

Referring to FIG. 3, a millimeter wave amplifier 300 (e.g., RF amplifier) may include a first transformer 311, an amplification stage 330, a second transformer 312, and one or more phase shifters 321 to 324. The first transformer 311 may be positioned on an input side of the millimeter wave amplifier 300 (e.g., an input side of the amplification stage 330), and the second transformer 312 may be positioned on an output side of the millimeter wave amplifier 300 (e.g., an output side of the amplification stage 330).

The one or more phase shifters 321 to 324 (e.g., a first phase shifter) may be a single-phase shifter or a differential phase shifter. The one or more phase shifters 321 to 324 (e.g., a first phase shifter) may be positioned on at least one of the input side and the output side of the first transformer 311 and the second transformer 312. For example, a to phase shifter Φ1 321 may be positioned on an input side of the first transformer 311, and a phase shifter Φ3 322 may be positioned on an output side of the first transformer 311. The phase shifter Φ1 321 may be a single-phase shifter, and the phase shifter Φ3 322 may be a differential phase shifter. A phase shifter Φ5 323 may be positioned on an input side of the second transformer 312, and a phase shifter Φ7 324 may be positioned on an output side of the second transformer 312. The phase shifter Φ5 323 may be a single-phase shifter, and the phase shifter Φ7 324 may be a differential phase shifter.

A single signal may be phase-shifted through the phase shifter Φ1 321 and converted into differential signals through the first transformer 311, as illustrated in FIG. 3. The differential signals converted by the first transformer 311 may be phase-shifted through the phase shifter Φ3 322. The differential signals phase-shifted by the phase shifter Φ3 322 may be amplified through the amplification stage 330. An output of the amplification stage 330 (e.g., amplified differential signals) may be phase-shifted by the phase shifter Φ5 323. The differential signals phase-shifted by the phase shifter Φ5 323 may be output as a single signal through the second transformer 312, and the single signal may be phase-shifted again through the phase shifter Φ7 324. The millimeter wave amplifier 300 may output a final phase-shifted single signal.

A signal input to the millimeter wave amplifier 300 may be amplified once and phase-shifted four times.

Figure 4:
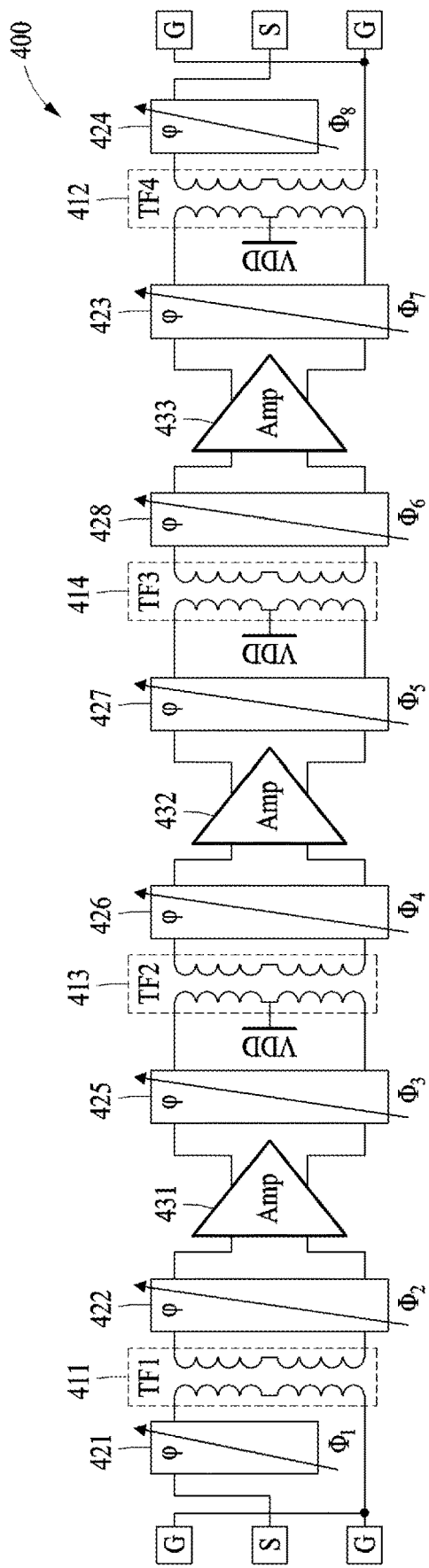
FIG. 4 is a diagram illustrating an example of a structure of a millimeter wave amplifier according to an example embodiment.

FIG. 4 is a diagram illustrating an example of a structure of a millimeter wave amplifier according to an example embodiment.

Referring to FIG. 4, a millimeter wave amplifier 400 (e.g., RF amplifier) may include a first transformer 411, a plurality of amplification stages 431 to 433, a second transformer 412, and one or more first phase shifters 421 to 424. The first transformer 411 may be positioned on an input side of the millimeter wave amplifier 400 (e.g., an input side of the to first amplification stage 431), and the second transformer 412 may be positioned on an output side of the millimeter wave amplifier 400 (e.g., an output side of a third amplification stage 433). For the convenience of description, a three-stage millimeter wave amplifier 400 may include three amplification stages, but the number of amplification stages are not limited thereto, and amplification stages may include N stages (e.g., N may be a natural number greater than two). The millimeter wave amplifier 400 may further include one or more third transformers 413 and 414 positioned between the amplification stages 431 to 433. For example, the transformer 413 may be positioned between a first amplification stage 431 and a second amplification stage 432, and the transformer 414 may be positioned between the second amplification stage 432 and a third amplification stage 433.

The millimeter wave amplifier 400 may further include one or more second phase shifters 425 to 428. The one or more second phase shifters 425 to 428 may be a single-phase shifter or a differential phase shifter. The one or more second phase shifters 425 to 428 may be positioned on at least one of an input side and an output side of the third transformers 413 and 414.

For example, the phase shifter Φ1 421 may be located on an input side of the first transformer 411, the phase shifter Φ8 424 may be positioned on an output side of the second transformer 412, and the phase shifter Φ1 421 and the phase shifter Φ8 424 may be a single-phase shifter. The remaining phase shifters (e.g., the first phase shifters 422 and 423 and the second phase shifters 425 to 428) may be differential phase shifters, excluding the phase shifter Φ1 421 and the phase shifter Φ8 424.

A total of eight phase shifters are illustrated in FIG. 4. However, some of the phase shifters may be removed based on how many phase shifters are needed. For the convenience of description, a three-stage millimeter wave amplifier is illustrated in FIG. 4, but the number of phase shifters may be reduced based on whether the millimeter wave amplifier is a first or second stage millimeter wave amplifier.

Figure 5:
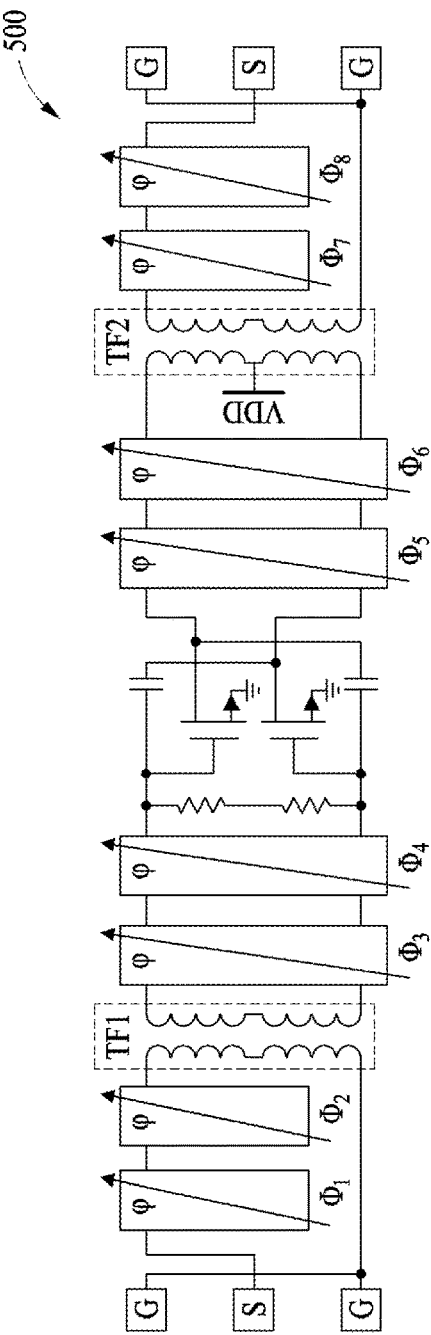
FIG. 5 is a diagram illustrating an example of a structure of a millimeter wave amplifier according to an example embodiment.

FIG. 5 is a diagram illustrating an example of a structure of a millimeter wave amplifier according to an example embodiment.

Referring to FIG. 5, a phase shifter may be connected in series in a millimeter wave amplifier 500. A phase shifter being implemented in the single-stage millimeter wave amplifier 500, and two-phase shifters being connected in series are illustrated in FIG. 5.

Phase shifters Φ1, Φ2, Φ7, and Φ8 may be single-phase shifters, and phase shifters .Φ3, Φ4, Φ5, and Φ6 may be differential phase shifters. A single-phase shifter may transmit and receive a single signal, and a differential phase shifter may transmit and receive differential signals. A single-phase shifter may be connected in series with single-phase shifters, and a differential phase shifter may be connected in series with differential phase shifters.

Two phase shifters being connected in series may be illustrated in FIG. 5, but three or four phase shifters may also be connected. In addition, a phase shifter may be partially removed based on performance required for the millimeter wave amplifier 500 and/or performance required for a device (e.g., a transceiver) including the millimeter wave amplifier 500.

Figure 6A:
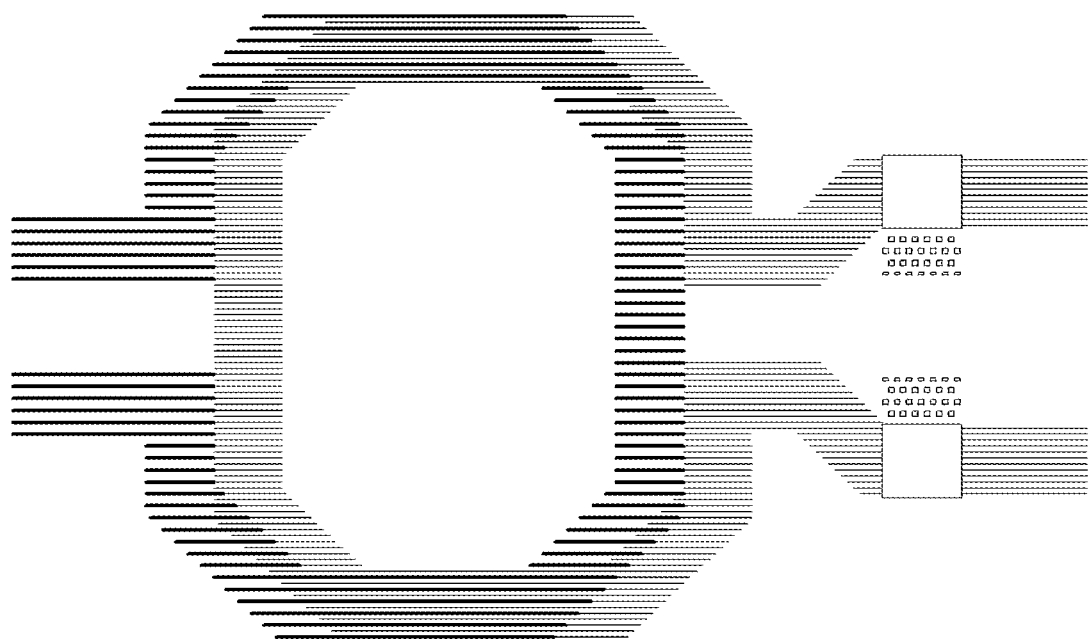
FIG. 6A is a diagram illustrating an example of a structure of a transformer according to an example embodiment.
Figure 6B:
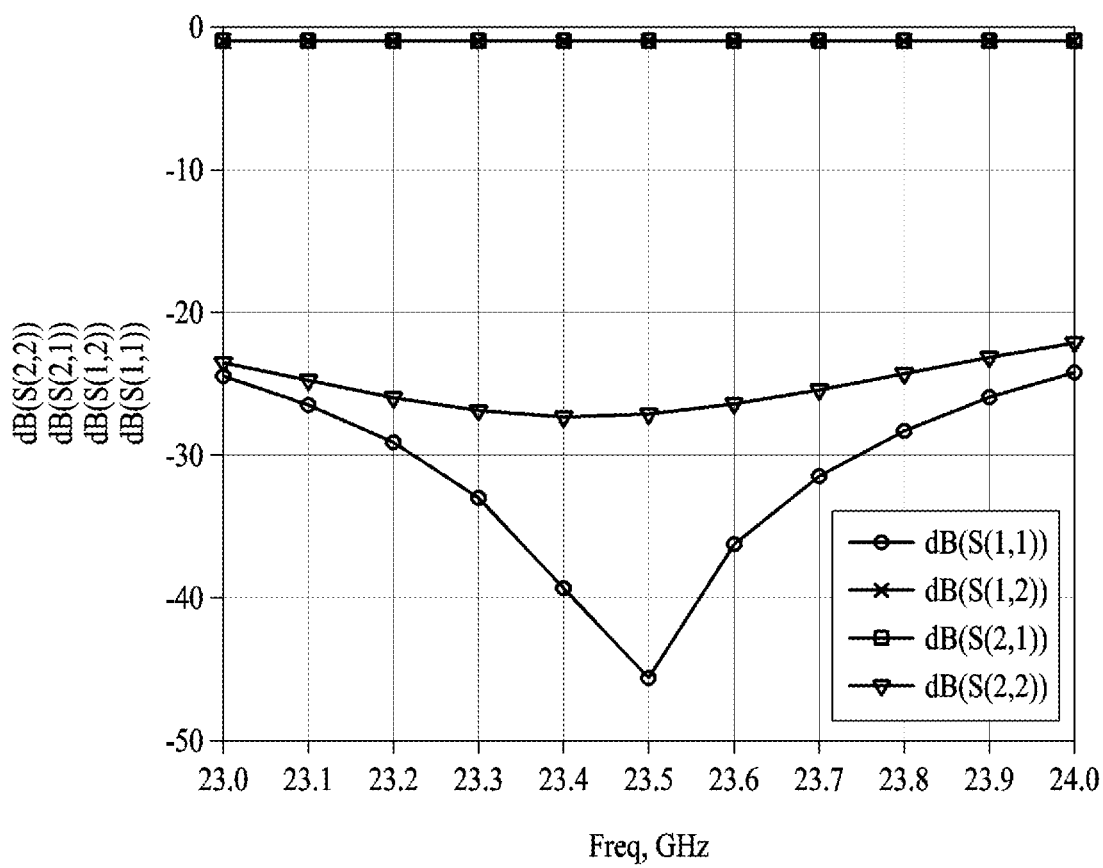
FIG. 6B is a diagram illustrating an example of a performance of a transformer according to an example embodiment.

FIG. 6A is a diagram illustrating an example of a structure of a transformer, and FIG. 6B is a diagram illustrating an example of a performance of a transformer.

FIG. 6A illustrates an example of a structure of a transformer used in millimeter wave and RF bands, and FIG. 6B illustrates an example of a performance of a transformer used in millimeter wave and RF bands.

Referring to FIG. 6A, the two leftmost terminals of the transformer may be terminals to which differential signals are input, and two rightmost terminals may be terminals to which the differential signals are output. When a single signal is input to the transformer, one input terminal among the input terminals of the transformer may be connected to a ground.

Referring to FIG. 6B, when a capacitor is connected to an input side and an output side, and an impedance is matched to 50 ohms, a loss occurring in the transformer may be calculated. The transformer may have a loss of 1.5 decibels (dB) and a reflection coefficient of the transformer may be less than −20 dB in a range from 23 gigahertz (GHz) to 24 GHz.

Figure 7A:
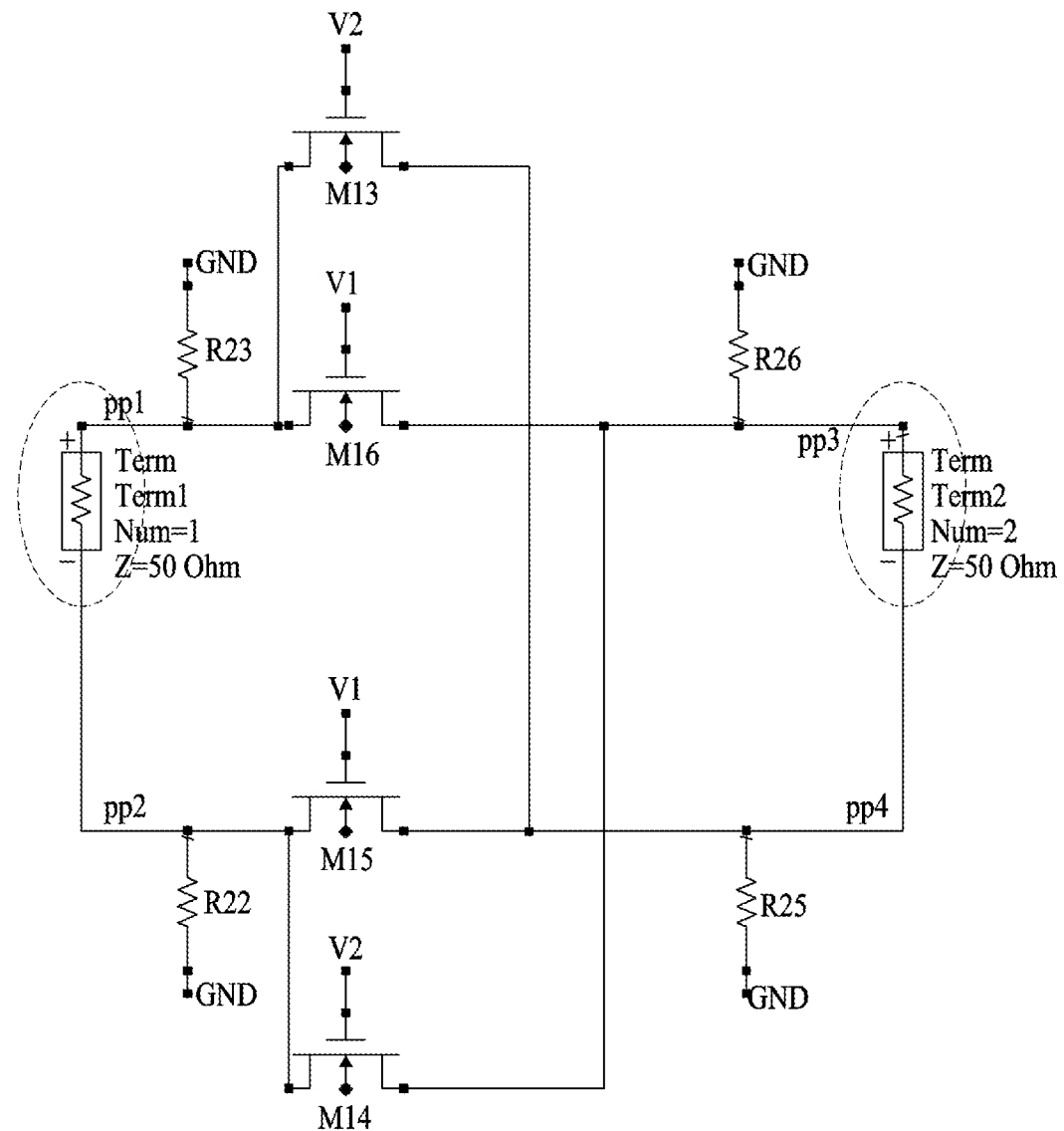
FIG. 7A is a diagram illustrating an example of a structure of a phase shifter according to an example embodiment.
Figure 7B:
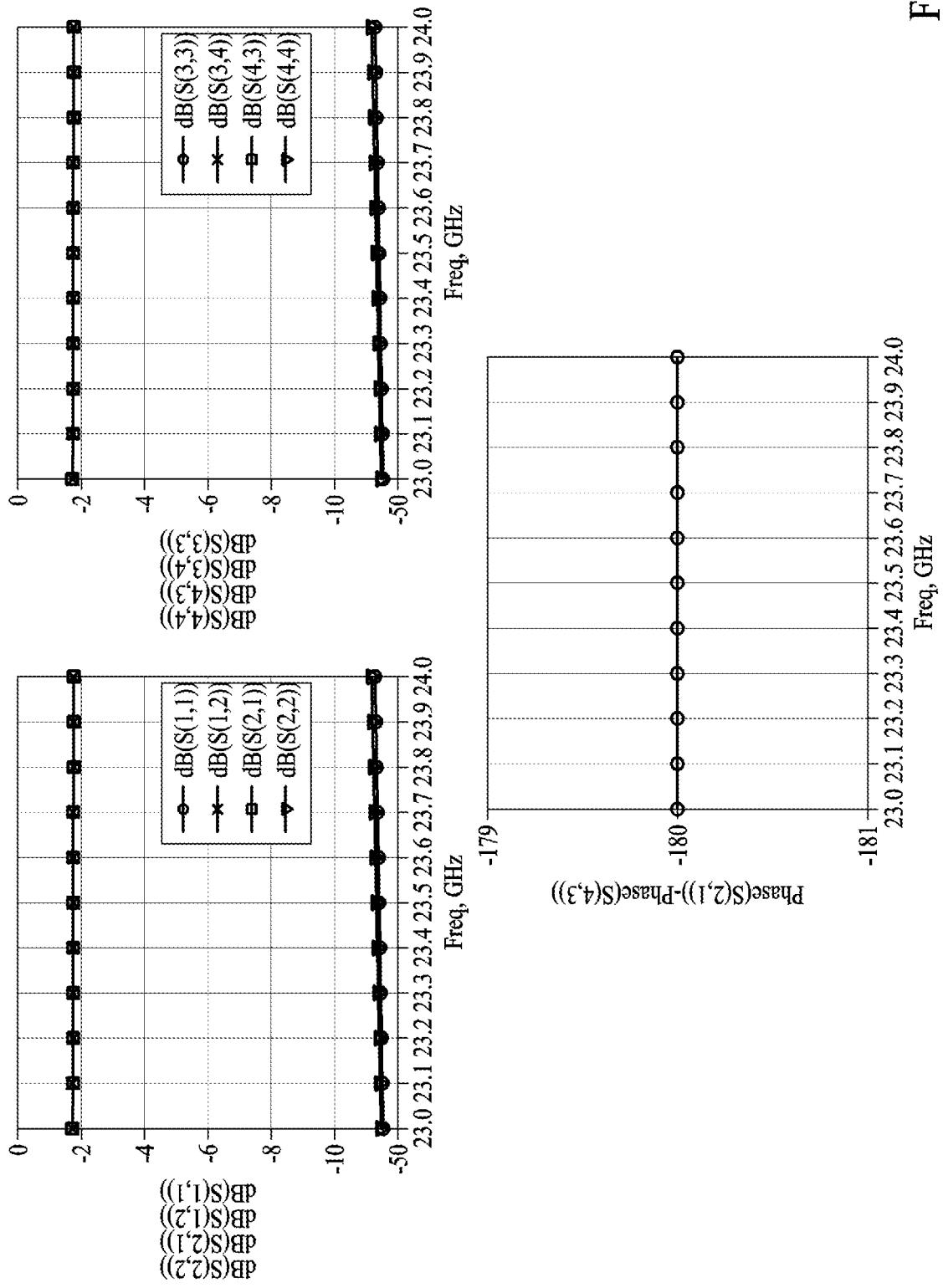
FIG. 7B is a diagram illustrating an example of a simulation test result of the phase shifter illustrated in FIG. 7 according to an example embodiment.

FIG. 7A is a diagram illustrating an example of a structure of a phase shifter, and FIG. 7B is a diagram illustrating an example of a simulation test result of the phase shifter illustrated in FIG. 7.

A phase shifter in FIG. 7A may be a 180° differential phase shifter. Control voltages V1 and V2 of the transistor pair may be opposite to each other. When 1 volt (V) is applied to V1, V2 may become 0V, and when 1V is applied to V2, V2 may become 0V. In FIG. 7A, input terminals may be pp1 and pp2, and output terminals may be pp3 and pp4. Referring to FIG. 7B, the 180° differential phase shifter in FIG. 7A may have a phase shift characteristic of 180° in a range from 23 GHz to 24 GHz. The 180° differential phase shifter may have a reflection coefficient of less than −11 dB and a loss of approximately 1.75 dB.

Figure 8A:
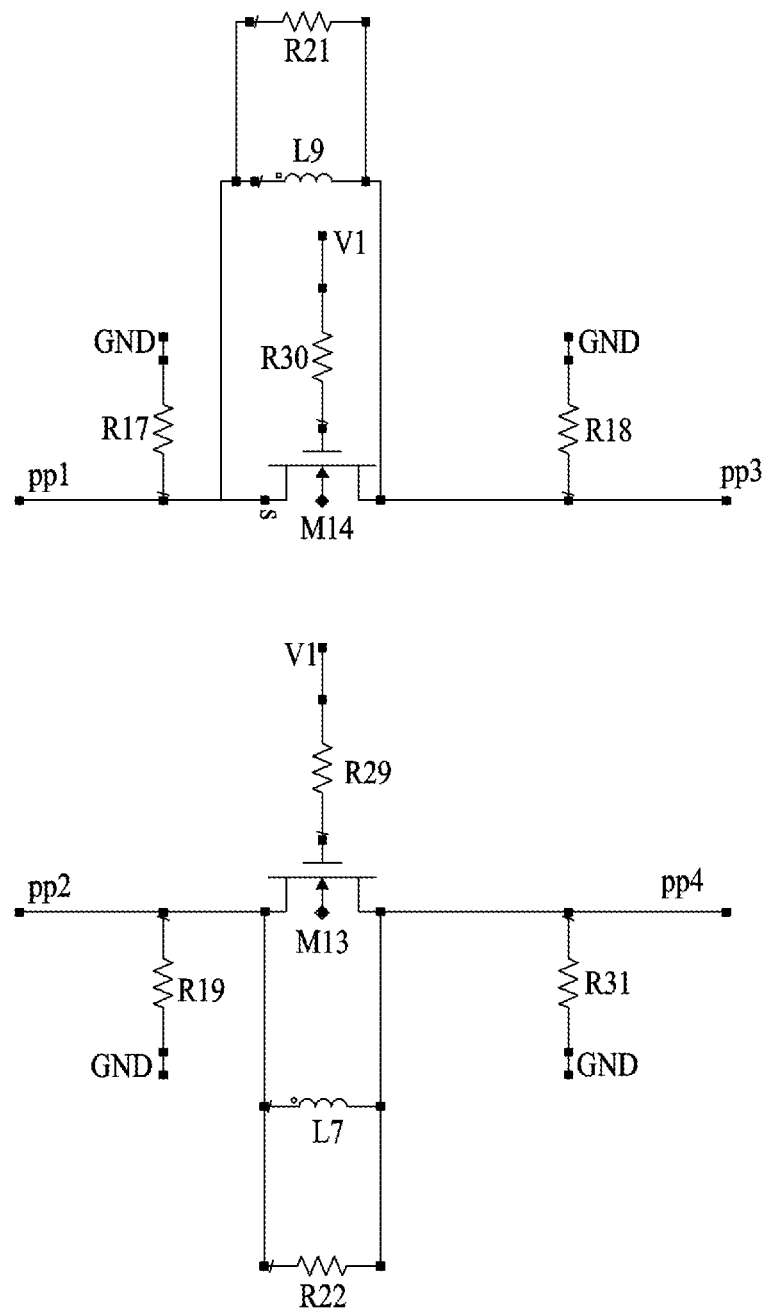
FIG. 8A is a diagram illustrating an example of a structure of a phase shifter according to an example embodiment.
Figure 8B:
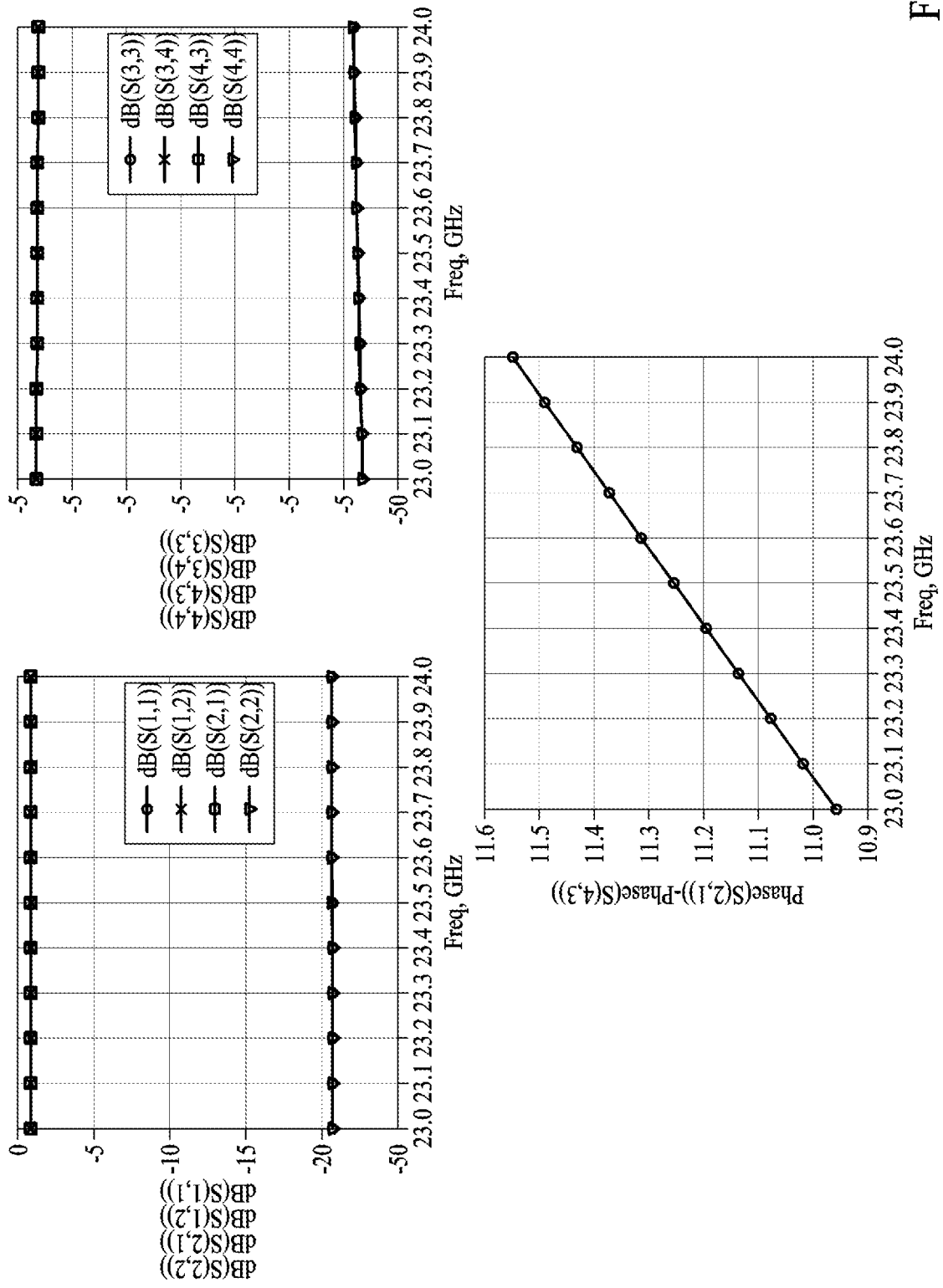
FIG. 8B is a diagram illustrating an example of a simulation test result of the phase shifter illustrated in FIG. 8A according to an example embodiment.

FIG. 8A is a diagram illustrating an example of a structure of a phase shifter, and FIG. 8B is a diagram illustrating an example of a simulation test result of the phase shifter illustrated in FIG. 8A.

A phase shifter in FIG. 8A may be a 11.25° differential phase shifter. Referring to FIG. 8A, resistors R21 and R22 may be used to minimize a change in amplitude when a switch is turned on/off. Referring to FIG. 8B, the 11.25° differential phase shifter in FIG. 8A may have a phase shift characteristic of 10.95° to 11.55° in a range from 23 GHz to 24 GHz. The 11.25° differential phase shifter may have a reflection coefficient of less than −12 dB and a loss of approximately 0.9 dB. Referring to FIGS. 7A and 7B, and FIGS. 8A and 8B, various differential phase shifters may be formed.

Figure 9A:
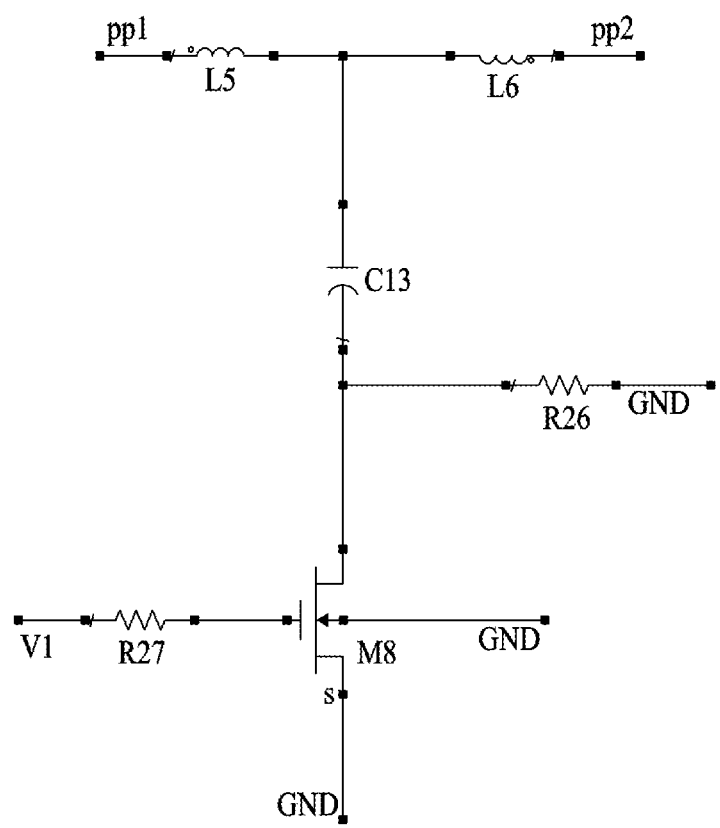
FIG. 9A is a diagram illustrating an example of a structure of a phase shifter according to an example embodiment.
Figure 9B:
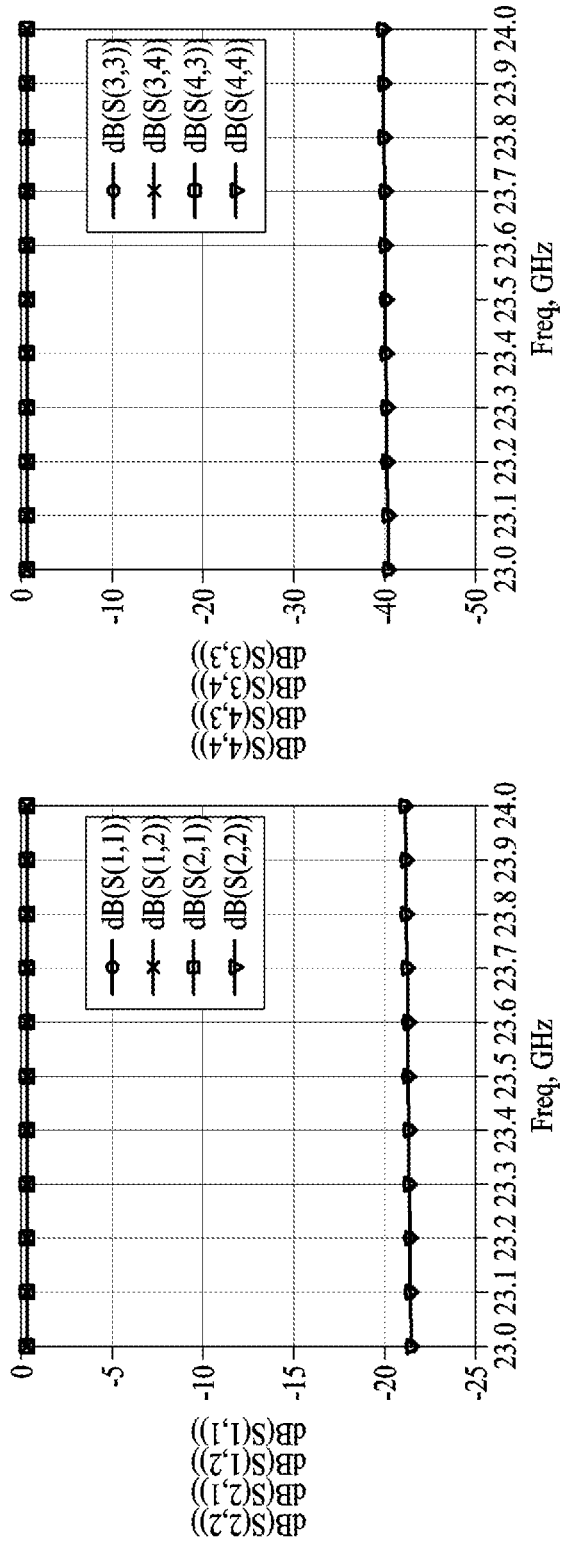
FIG. 9B is a diagram illustrating an example of a simulation test result of the phase shifter illustrated in FIG. 9A according to an example embodiment.

FIG. 9A is a diagram illustrating an example of a structure of a phase shifter, and FIG. 9B is a diagram illustrating an example of a simulation test result of the phase shifter illustrated in FIG. 9A.

Figure 9B:
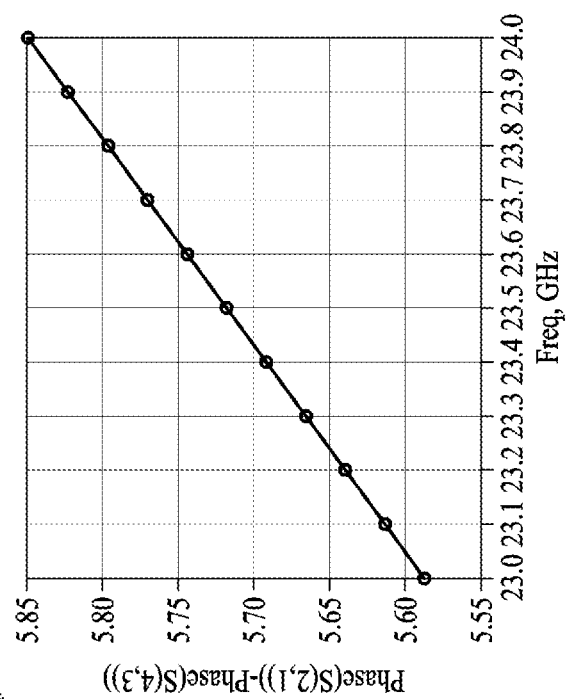

A phase shifter in FIG. 9A may be a 5.625° single-phase shifter. Referring to FIG. 9A, a resistor R26 may be used to minimize a change in amplitude when a switch is turned on/off. Referring to FIG. 9B, the 5.625° single-phase shifter in FIG. 9A may have a phase shift characteristic of 5.59° to 5.85° in a range from 23 GHz to 24 GHz. A 5.625° single-phase shifter may have a reflection coefficient of less than −20 dB and a loss of approximately 0.35 dB. Referring to FIG. 9, various single-phase shifters may be formed.

Figure 10A:
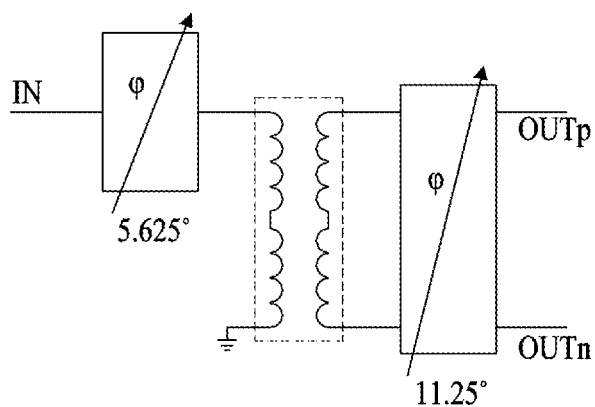
FIG. 10A is a diagram illustrating an example of a structure of a differential phase shifter, a single-phase shifter, and a transformer connected according to an example embodiment.
Figure 10B:
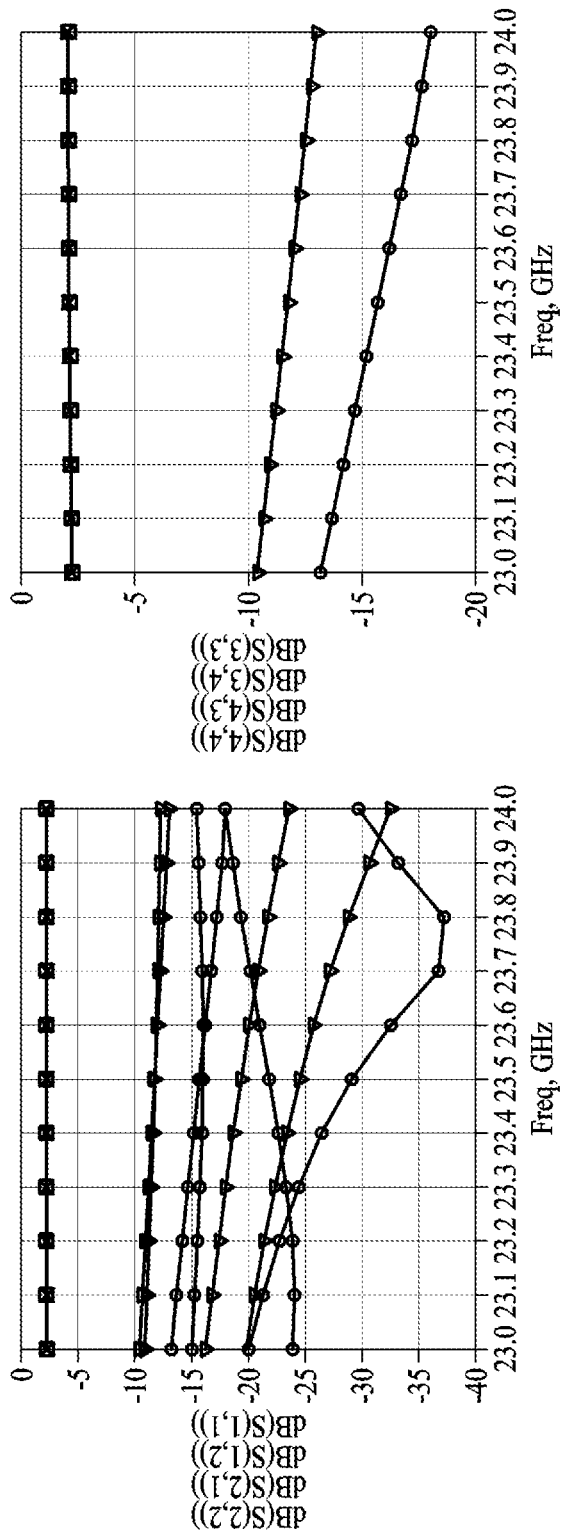
FIG. 10B is a diagram illustrating an example of a simulation test result of the phase shifter illustrated in FIG. 10A according to an example embodiment.
Figure 10B:
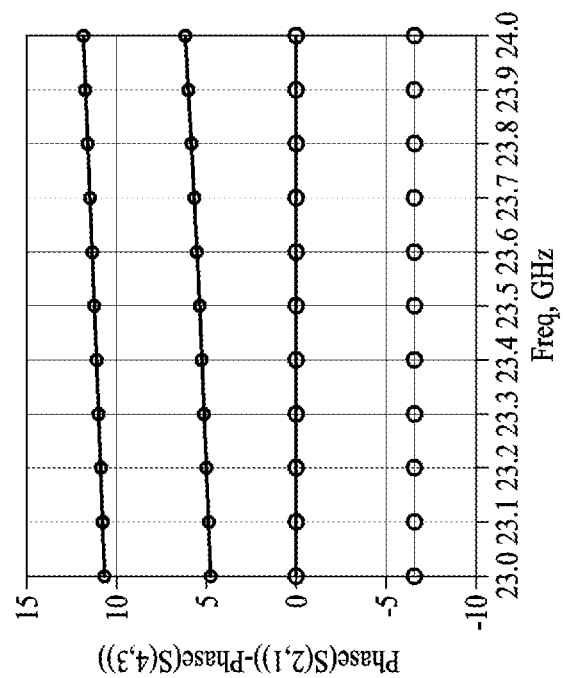

FIG. 10A is a diagram illustrating an example a structure of a differential phase shifter, a single-phase shifter, and a transformer connected according to an example embodiment, and FIG. 10B is a diagram illustrating an example of a simulation test result of the phase shifter illustrated in FIG. 10A.

Referring to FIG. 10A, a 11.25° differential phase shifter, a 5.625° single-phase shifter, and a transformer may be connected. The transformer may be used to connect a single-phase shifter and a differential phase shifter. One input terminal among input terminals of the transformer may be connected to the single-phase shifter, and another input terminal among the input terminals of the transformer may be connected to a ground. Referring to FIG. 10B, a circuit to which the 11.25° differential phase shifter, a 5.625° single-phase shifter, and a transformer are connected may have phase shift characteristics of −6°, 0°, 5.2°, and 11° in a range from 23 GHz to 24 GHz. The 11.25° differential phase shifter, the 5.625° single-phase shifter, and the circuit to which the transformer is connected may have a reflection coefficient of less than −11 dB and a loss of approximately 2.8 dB. Referring to FIGS. 10A and 10B, a circuit may include a single-phase shifter, a differential to phase shifter, and a transformer, and the circuit may have various phase shift characteristics.

Figure 11:
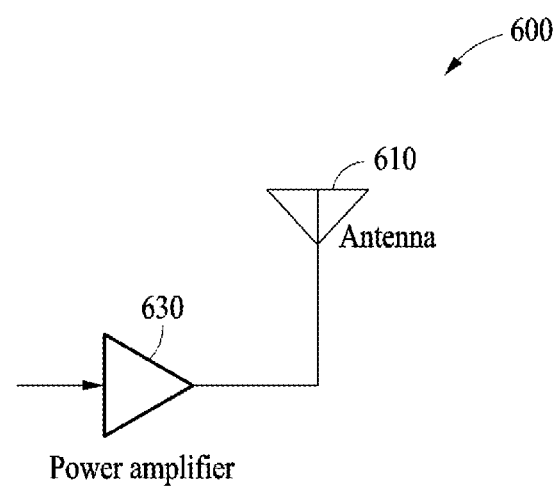
FIG. 11 is a diagram illustrating an example of a structure of a transmitter including a millimeter wave amplifier according to an example embodiment.

FIG. 11 is a diagram illustrating an example of a structure of a transmitter including a millimeter wave amplifier according to an example embodiment.

Referring to FIG. 11, a transmitter 600 may include an antenna 610 and an amplifier 630. The transmitter 600 may receive a signal (e.g., RF signal) through the antenna 610 and perform amplification and/or frequency conversion on the signal.

The amplifier 600 may be a millimeter wave amplifier (e.g., the millimeter wave amplifier 100 in FIG. 1, the millimeter wave amplifier 200 in FIG. 2, the millimeter wave amplifier 300 in FIG. 3, the millimeter wave amplifier 400 in FIG. 4, and the millimeter wave amplifier 500 in FIG. 5). A structure and operations of the amplifier 600 may be substantially the same as the structure and the operations of millimeter wave amplifiers 100 to 500 described with reference to FIGS. 1 to 10. Thus, a more detailed description is not included here, for brevity.

The described hardware devices may be configured to act as one or more software modules in order to perform the operations of the above-described example embodiments, or vice versa.

While this disclosure includes example embodiments, it will be apparent to one of ordinary skill in the art that various changes in form and details may be made in these example embodiments without departing from the spirit and scope of the claims and their equivalents. The example embodiments described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner and/or replaced or supplemented by other components or their equivalents.

Therefore, the scope of the disclosure is defined not by the detailed description, but by the claims and their equivalents, and all variations within the scope of the claims and their equivalents are to be construed as being included in the disclosure.

What is claimed is:

1. A millimeter wave amplifier, comprising:
a first transformer positioned on an input side of the millimeter wave amplifier;
a second transformer positioned on an output side of the millimeter wave amplifier;
one or more amplification stages positioned between the first transformer and the second transformer; and
a first phase shifter positioned on at least one of an input side and an output side of the first transformer and an input side and an output side of the second transformer.

2. The millimeter wave amplifier of claim 1, wherein one input terminal among input terminals of the first transformer is connected to a ground, and one output terminal among output terminals of the second transformer is connected to a ground.

3. The millimeter wave amplifier of claim 1, further comprising:
one or more of third transformers positioned on the one or more of amplification stages.

4. The millimeter wave amplifier of claim 3, further comprising:
a second phase shifter positioned on at least one of an input side and an output side of the third transformer.

5. The millimeter wave amplifier of claim 4, wherein the second phase shifter is a single-phase shifter or a differential phase shifter.

6. The millimeter wave amplifier of claim 4, wherein, of the third transformer being connected to a single-phase shifter, one terminal among connected terminals is connected to a ground.

7. The millimeter wave amplifier of claim 1, wherein, the first phase shifter is a single-phase shifter or a differential phase shifter.

8. The millimeter wave amplifier of claim 1, wherein, of the first transformer and the second transformer being connected to a single-phase shifter, one terminal among connected terminals is connected to a ground.

9. A transmitter, comprising:
a millimeter wave amplifier,
wherein the millimeter wave amplifier comprises:
a first transformer positioned on an input side of the millimeter wave amplifier;
a second transformer positioned on an output side of the millimeter wave amplifier;
one or more amplification stages positioned between the first transformer and the second transformer; and
a first phase shifter positioned on at least one of an input side and an output side of the first transformer and an input side and an output side of the second transformer.

10. The transmitter of claim 9, wherein one input terminal among input terminals of the first transformer is connected to a ground, and one output terminal among output terminals of the second transformer is connected to a ground.

11. The transmitter of claim 9, further comprising:
one or more of third transformers positioned on the one or more of amplification stages.

12. The transmitter of claim 11, further comprising:
a second phase shifter positioned on at least one of an input side and an output side of the third transformer.

13. The transmitter of claim 12, wherein the second phase shifter is a single-phase shifter or a differential phase shifter.

14. The transmitter of claim 12, wherein, of the third transformer being connected to a single-phase shifter, one terminal among connected terminals is connected to a ground.

15. The transmitter of claim 9, wherein the first phase shifter is a single-phase shifter or a differential phase shifter.

16. The transmitter of claim 9, wherein, of the first transformer and the second transformer being connected to a single-phase shifter, one terminal among connected terminals is connected to a ground.

17. A millimeter wave amplifier, comprising:
one or more amplification stages;
a first transformer configured to convert a single signal into differential signals and transmit the converted signal to an amplification stage;
a second transformer configured to output differential signals output from an amplification stage as a single signal; and one or more phase shifters positioned on one or more of an input side and an output side of the first transformer and an input side and an output side of the second transformer, and configured to phase-shift one or more of the single signal input to the first transformer, an output signal of the first transformer, the differential signals output from the amplification stage, and the single signal output from the second transformer.

* * * * *